United States Patent
Tanaka et al.

[11] Patent Number: 6,061,550
[45] Date of Patent: *May 9, 2000

[54] RADIO TRANSMITTER

[75] Inventors: Hiroaki Tanaka, Mishima-gun; Motoi Nakanishi, Nagaokakyo, both of Japan

[73] Assignee: Murata Manufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/720,578

[22] Filed: Oct. 2, 1996

[30] Foreign Application Priority Data

Oct. 4, 1995 [JP] Japan ................................. 7-257873

[51] Int. Cl.$^7$ ................................................. H04B 1/02
[52] U.S. Cl. .............................. 455/91; 455/121; 455/129
[58] Field of Search ...................... 455/91, 92, 95, 455/128, 129, 108, 110, 111, 121, 124; 340/425.5; 331/107 A, 108 B

[56] References Cited

U.S. PATENT DOCUMENTS

| | | | |
|---|---|---|---|
| 3,813,614 | 5/1974 | Darrow | 331/108 B |
| 4,327,444 | 4/1982 | Court | 455/129 |
| 4,761,616 | 8/1988 | Ash | 331/108 B |
| 5,534,845 | 7/1996 | Issa et al. | 340/425.5 |

*Primary Examiner*—Thanh Cong Le
*Attorney, Agent, or Firm*—Ostrolenk, Faber, Gerb & Soffen, LLP

[57] ABSTRACT

In a radio transmitter, an amplifier, a resonator and an antenna together form an oscillation loop. The oscillating energy of the oscillation loop is efficiently emitted from the antenna as a radio wave. Most of the oscillation power of the oscillation loop is supplied to the radiation resistance of the antenna because the transmitter has no components outside the loop which may consume the oscillation power.

3 Claims, 2 Drawing Sheets

RADIO TRANSMITTER

BACKGROUND OF THE INVENTION

1. Field of the Invention

The present invention relates to a radio transmitter for use in apparatus such as radio communication apparatus, remote control apparatus, wireless LAN apparatus, and key-less entry apparatus.

2. Description of the Related Art

FIG. 4 shows a circuit for a conventional radio transmitter, which includes a Colpitts oscillator. The collector of a transistor Tr is connected to ground through a series circuit including bias resistors R1 and R2 as well as to the power voltage $V_{CC}$. The base of the transistor is connected to ground through a series circuit including capacitors C1 and C2, and through a SAW resonator "re", the base being connected to a connecting point where the resistors R1 and R2 and the SAW resonator "re" are connected. The emitter of the transistor is connected to a connecting point where the capacitors C1 and C2 are connected, and to ground through a resistor R3. In addition, the collector of the transistor Tr is connected to ground through a series circuit including a capacitor C3, an antenna ANT, and a capacitor C4. The antenna ANT emits a radio wave which is received from the collector side of the transistor Tr.

Since the antenna is disposed outside the oscillation loop in the conventional radio transmitter, oscillating power is supplied to both the oscillation loop and the antenna. Thus, the efficiency of power transmission from the oscillation loop to the antenna is relatively low.

SUMMARY OF THE INVENTION

Accordingly, it is an object of the present invention to provide a compact radio transmitter having a simple circuit configuration with high efficiency of radio wave emission.

To achieve the above object, one aspect of the present invention provides a radio transmitter including an amplifier, a resonator operatively connected to the amplifier to form an oscillation loop, and an antenna incorporated into the oscillation loop.

Another aspect of the present invention provides a radio transmitter including an amplifier, a phase circuit operatively connected to the amplifier to form an oscillation loop, and an antenna incorporated into the oscillation loop.

The phase circuit may include a delay circuit, a phase control circuit, or both.

The phase circuit may include an SAW delay line.

A further aspect of the present invention provides a radio transmitter having a substrate, an antenna formed on the substrate, an SAW delay circuit formed on the substrate, connected to the antenna, and an amplifier formed on the substrate, connected to the both the antenna and the SAW delay circuit to form an oscillation loop.

According to the present invention, since the antenna forms a part of the oscillation loop, some of the energy accumulated in the oscillation loop is consumed by the radiation resistance of the antenna. Thus, a loss of the energy at the other circuit components in the oscillation loop is reduced. This causes an improved emitting efficiency. In addition, since the antenna is disposed in the oscillation loop, the circuit configuration is made simple and the circuit becomes compact and easy to manufacture.

Other features and advantages of the present invention will become apparent from the following description of the invention which refers to the accompanying drawings.

DETAILED DESCRIPTION OF EMBODIMENTS OF THE INVENTION

Figure 1:
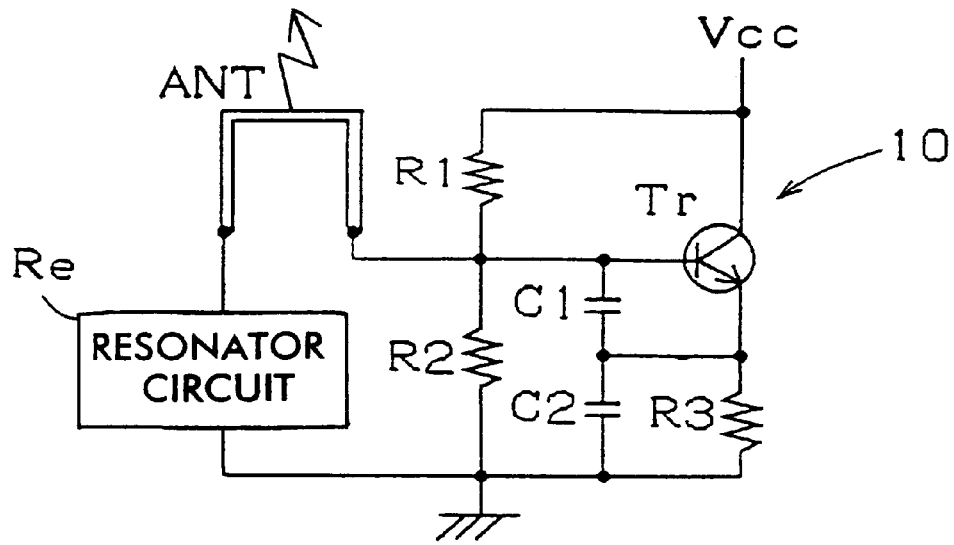
FIG. 1 is a circuit diagram of a radio transmitter according to a first embodiment of the present invention.

A radio transmitter according to a first embodiment of the present invention will be described below by referring to FIG. 1. In this radio transmitter, a conventional Colpitts oscillator 10 may be used. The collector of a transistor Tr is connected to ground through a series circuit including bias resistors R1 and R2 as well as to the power voltage $V_{CC}$. The base of the transistor is connected to ground through a series circuit including capacitors C1 and C2. The base is also connected to ground through the connecting point where the resistors R1 and R2 are connected, and where a series circuit of an antenna ANT and a resonator circuit "Re" is also connected. The emitter of the transistor is connected to a connection point of the capacitors C1 and C2, and to ground through a resistor R3. The resonator circuit "Re" may be a LC resonator circuit, or a circuit including an electromechanical converter element (i.e., an element which converts electrical energy to mechanical energy), such as an SAW resonator, a crystal resonator, a lithium-tantalate resonator, or a tantalate-niobate resonator. In this transmitter, an oscillation loop is formed by a closed circuit including the resonator circuit Re, the antenna ANT, and the base and emitter of the transistor Tr, which constitutes the Colpitts oscillator 10.

As described above, the antenna ANT is disposed in the oscillation loop of the Colpitts oscillator 10 in this transmitter. Therefore, when the power voltage $V_{CC}$ is applied, oscillation starts due to the amplification function of the transistor Tr at the resonant frequency unique to the resonator circuit Re. High-frequency current flows through the antenna ANT disposed in the oscillation loop, and this high-frequency current is emitted from the antenna ANT as a radio wave.

In the above embodiment, a Colpitts oscillator is used as the oscillation circuit. Other oscillators which are conventionally known, such as a Hartley oscillator, a tuned base oscillator, a tuned collector oscillator, a Wien bridge oscillator, and a phase-shift oscillator, may also be used.

Figure 2:
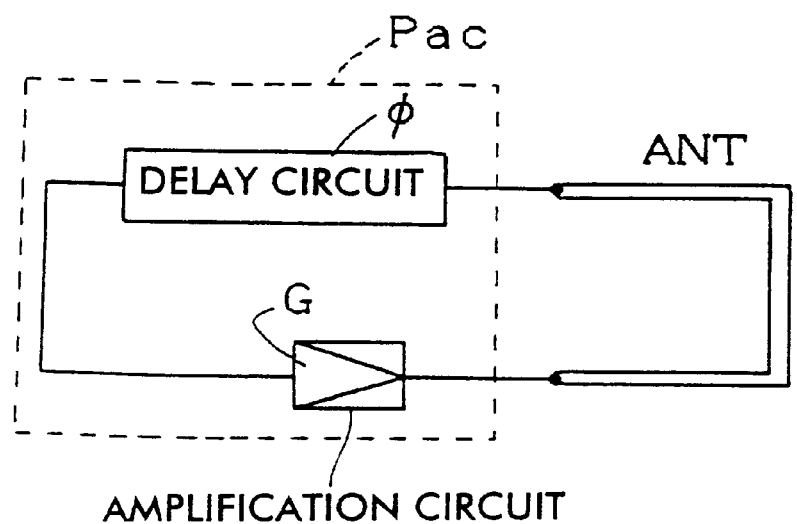
FIG. 2 is a circuit diagram of a radio transmitter according to a second embodiment of the present invention.

A radio transmitter according to a second embodiment of the present invention will be described below by referring to FIG. 2. A phase-shift oscillator is used as an oscillation circuit in this embodiment. In FIG. 2, an oscillation loop is made up of a delay circuit φ, an antenna ANT, and an amplification circuit G. The amplification circuit G has a phase difference of 180 degrees between the input and the output, and the output of the amplification circuit G is delayed by 180 degrees by the delay circuit φ and is input to the amplification circuit G. Therefore, this oscillation loop continues to oscillate.

Also in this embodiment, a high-frequency current of the oscillation loop directly flows through the antenna ANT and this high-frequency current is emitted from the antenna ANT as a radio wave, in the same way as in the first embodiment.

The delay circuit φ in the above embodiment may be made up of an SAW delay line, an integral-type phase circuit, or a differential phase circuit of a phase-lead circuit type. The delay circuit φ and the amplification circuit G may be integrated into one package Pac as shown by a dotted line.

Phase circuits such as the delay circuit φ may have a phase control circuit. Alternatively, a phase control circuit may be provided outside.

Figure 3:
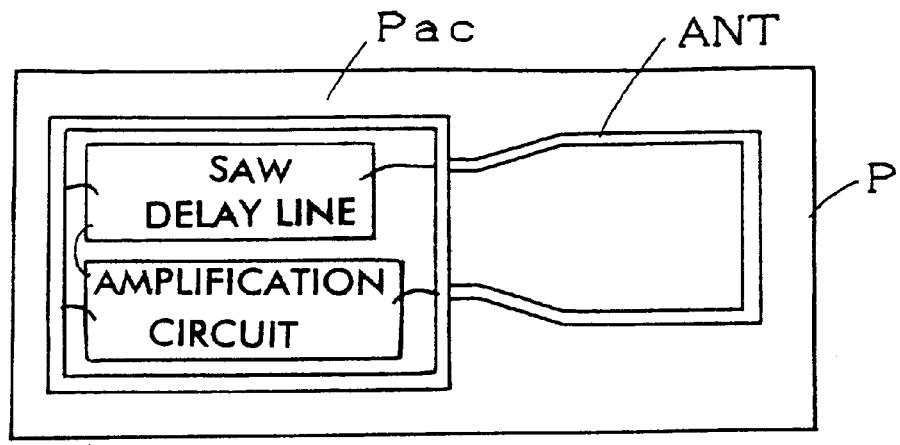
FIG. 3 is a plan of a radio transmitter according to a third embodiment of the present invention.
Figure 4:
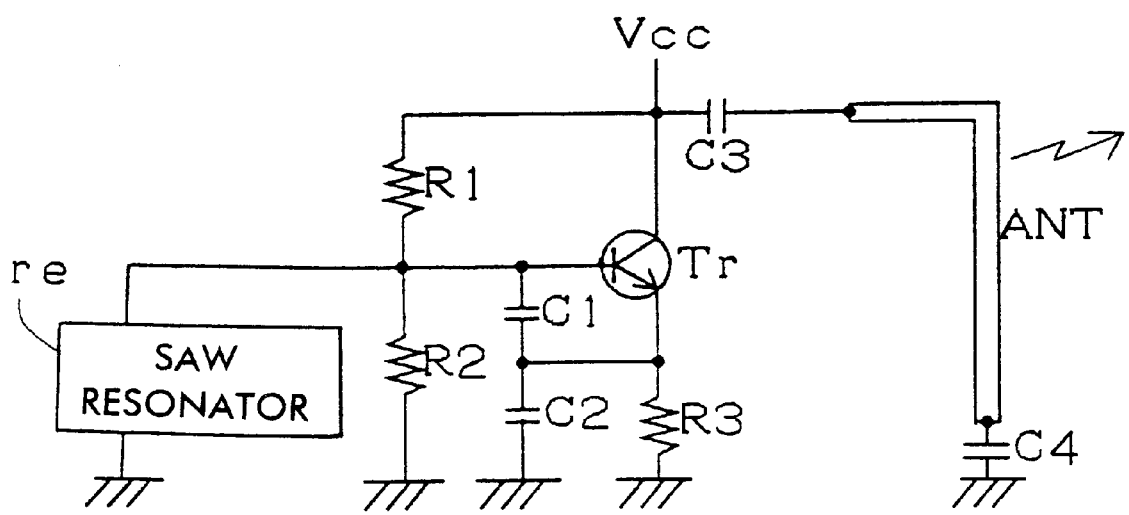
FIG. 4 is a circuit diagram of a conventional radio transmitter.

FIG. 3 shows a radio transmitter according to a third embodiment of the present invention. An SAW delay line and an amplification circuit (IC) are integrated into one package Pac. A pattern antenna ANT is formed on a printed circuit board P by printing or deposition. The package Pac is mounted on the printed circuit board P and the pattern antenna ANT and the package Pac are connected at the specified points to form a compact radio transmitter implemented on the printed circuit board.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A radio transmitter comprising:

an amplifier;

a resonator operatively connected to said amplifier to form an oscillation loop; and an antenna incorporated into said oscillation loop, said antenna being connected to an input side of said amplifier.

2. A radio transmitter according to claim 1, wherein said antenna and said resonator are connected in series.

3. A radio transmitter according to claim 2, wherein said resonator includes an SAW frequency determining element.

* * * * *